United States Patent
Parisi et al.

(10) Patent No.: US 12,210,089 B2
(45) Date of Patent: Jan. 28, 2025

(54) OSCILLATOR CIRCUIT, CORRESPONDING RADAR SENSOR, VEHICLE AND METHOD OF OPERATION

(71) Applicant: STMicroelectronics S.r.l., Agrate Brianza (IT)

(72) Inventors: Alessandro Parisi, Mascalucia (IT); Andrea Cavarra, Catania (IT); Alessandro Finocchiaro, Catania (IT); Giuseppe Papotto, Biancavilla (IT); Giuseppe Palmisano, Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/418,298

(22) Filed: Jan. 21, 2024

(65) Prior Publication Data

US 2024/0151844 A1 May 9, 2024

Related U.S. Application Data

(63) Continuation of application No. 18/108,993, filed on Feb. 13, 2023, now Pat. No. 11,879,963, which is a
(Continued)

(30) Foreign Application Priority Data

Aug. 7, 2020 (IT) .................. 102020000019786

(51) Int. Cl.
*G01S 13/58* (2006.01)
*G01S 7/40* (2006.01)
(Continued)

(52) U.S. Cl.
CPC .......... *G01S 13/584* (2013.01); *G01S 7/4056* (2013.01); *G01S 13/931* (2013.01);
(Continued)

(58) Field of Classification Search
CPC .... G01S 13/584; G01S 7/4056; G01S 13/931; H03B 5/1212; H03B 5/1228;
(Continued)

(56) References Cited

U.S. PATENT DOCUMENTS 6,114,920 A    9/2000   Moon et al.
6,496,075 B2 * 12/2002   Justice ................. H03B 5/1265
                                                    331/11
(Continued)

FOREIGN PATENT DOCUMENTS

EP          3439180 A1    2/2019
WO       02073789 A1    9/2002

OTHER PUBLICATIONS

Hou, C., et al, "A 20 GHz PLL for 40 Gbps SerDes application with 4 bit switch-capacitor adaptive controller," 2014 IEEE International Conference on Electron Devices and Solid-State Circuits, Chengdu, 2014, pp. 1-2.
(Continued)

*Primary Examiner* — Arnold M Kinkead
(74) *Attorney, Agent, or Firm* — Crowe & Dunlevy LLC

(57) ABSTRACT

A flash analog-to-digital converter (ADC) receives an input control signal and performs coarse tuning of a frequency of an output signal, produced between first and second nodes having an inductance coupled therebetween. The flash ADC quantizes an operating frequency range for the output signal produced between the first and second nodes as $M \cdot \Delta f$, where M is an integer from 0 to N−1, where N is a number of intervals into which a frequency range for the output signal is divided, and where $\Delta f$ is a resulting frequency step produced by the quantizing. The value of M is generated based upon the input control signal and a word controlling switches of a plurality of switched capacitance circuits associated with the first and second nodes to close ones of
(Continued)

those switches associated with the control word to coarsely tune the frequency of the output signal.

13 Claims, 8 Drawing Sheets

Related U.S. Application Data continuation of application No. 17/395,016, filed on Aug. 5, 2021, now Pat. No. 11,604,267.

(51) Int. Cl.
| | | |
|---|---|---|
| *G01S 13/931* | (2020.01) | |
| *H03B 5/12* | (2006.01) | |
| *H03L 7/099* | (2006.01) | |
| *H03L 7/10* | (2006.01) | |
| *H03L 7/193* | (2006.01) | |

(52) U.S. Cl.
CPC ......... *H03B 5/1212* (2013.01); *H03B 5/1228* (2013.01); *H03B 5/1243* (2013.01); *H03B 5/1265* (2013.01); *H03B 5/1293* (2013.01); *H03L 7/099* (2013.01); *H03L 7/101* (2013.01); *H03L 7/103* (2013.01); *H03L 7/193* (2013.01)

(58) Field of Classification Search
CPC .. H03B 5/1243; H03B 5/1265; H03B 5/1293; H03B 23/00; H03L 7/099; H03L 7/101; H03L 7/103; H03L 7/193; H03J 5/24
USPC ................................. 331/167, 177 V, 117 FE
See application file for complete search history.

(56) References Cited

U.S. PATENT DOCUMENTS

| | | | |
|---|---|---|---|
| 7,728,676 B2* | 6/2010 | Nathawad | H03B 5/1228 |
| | | | 331/177 R |
| 10,833,685 B1 | 11/2020 | Chakraborty et al. | |
| 2003/0222726 A1 | 12/2003 | Yonekawa et al. | |
| 2016/0365890 A1 | 12/2016 | Reynolds et al. | |
| 2017/0085270 A1 | 3/2017 | Suzuki et al. | |
| 2021/0364619 A1 | 11/2021 | Landsberg et al. | |

OTHER PUBLICATIONS

Shi, C., et al, "A dual loop dual VCO CMOS PLL using a novel coarse tuning technique for DTV," 2008 9th International Conference on Solid-State and Integrated-Circuit Technology, Beijing, 2008, pp. 1597-1600.

IT Search Report and Written Opinion for IT Appl. No. 102020000019786 dated Apr. 9, 2021 (8 pages).

* cited by examiner

OSCILLATOR CIRCUIT, CORRESPONDING RADAR SENSOR, VEHICLE AND METHOD OF OPERATION

RELATED APPLICATION

This application is a continuation of U.S. patent application Ser. No. 18/108,993, filed Feb. 13, 2023, now U.S. Pat. No. 11,879,963, itself a continuation of U.S. patent application Ser. No. 17/395,016, filed Aug. 5, 2021, now U.S. Pat. No. 11,604,267, which claims the priority benefit of Italian Application for Patent No. 102020000019786, filed on Aug. 7, 2020, the contents of which are hereby incorporated by reference in their entireties to the maximum extent allowable by law.

TECHNICAL FIELD

The description relates to phase-locked loop (PLL) circuits. Embodiments as described herein may be used, for instance, in radar detection systems, such as those increasingly used in automotive advanced driver assistance systems (ADAS).

BACKGROUND

Short-range radar sensors and/or long-range radar sensors may be placed around a vehicle (e.g., a car) to detect objects near and/or around the vehicle. Radar sensor data can be processed (e.g., by a processing unit in the vehicle) to prevent an accident, prepare the vehicle for an accident, or take actions to reduce the severity of an accident. Purely by way of example, possible applications of advanced driver assistance systems are adaptive cruise control, pre-crash safety systems, blind spot detection, lane change assistance, etc.

Conventional (e.g., standard) specifications for the operational frequency band of short-range radar sensors and long-range radar sensors are 77 GHz to 81 GHz and 76 GHz to 77 GHz, respectively. Those frequency bands correspond to wavelengths in the order of a few millimeters (mm, 1 mm=$10^{-3}$ m).

Frequency-modulated continuous-wave (FMCW) radar systems may be used for such mm-wave radar applications in the automotive sector. The frequency-modulated continuous-wave radar working principle is exemplified in FIG. 1, which is a diagram exemplary of a possible time-frequency relationship of radar signals in a FMCW radar system.

As exemplified in FIG. 1, a FMCW radar system may transmit (e.g., periodically) a transmission signal TX (exemplified by the solid line in FIG. 1), also referred to as a "chirp", whose frequency sweeps (e.g., linearly) a frequency range F over a certain time interval $T_m$ (e.g., having a duration $T_m$ in the range of 10 μs to 40 μs, 1 μs=$10^{-6}$ s). For instance, the frequency range F may be a 4-GHz range between 77 GHz and 81 GHz for a short-range radar, or a 1-GHz range between 76 GHz and 77 GHz for a long-range radar.

The FMCW radar system may subsequently receive a corresponding echo signal RX (exemplified by the dash-and-dot line in FIG. 1) generated by reflection of the transmission signal TX at a target object.

As exemplified in FIG. 1, the FMCW radar system may detect a first time instant $t_1$ when the frequency of the transmission signal TX is equal to a reference value $f_1$, with $f_1$ comprised in the frequency range F. The FMCW radar system may subsequently detect a second time instant $t_2$ when the frequency of the echo signal RX is equal to the reference value $f_1$, and detect the frequency $f_2$ of the transmission signal TX at the second time instant $t_2$. The FMCW radar system may thus compute a frequency value $f_R$ as a difference between the frequency $f_2$ and the reference frequency $f_1$.

The time interval $t_R$ between the first time instant $t_1$ and the second time instant $t_2$ is a function of (e.g., it is proportional to) the distance R between the radar sensor and the target object, according to the following equation, where c is the propagation speed of the radar signals TX and RX:

$$t_R = \frac{2R}{c}$$

The slope of the "chirp" of the radar signal TX as exemplified in FIG. 1 may be computed according to the following equation:

$$\text{slope} = \frac{F}{T_m} = \frac{f_R}{t_R} = \frac{f_R}{\frac{2R}{c}}$$

Therefore, the distance R between the radar sensor and the target object may be computed as follows:

$$R = \frac{f_R \cdot c \cdot T_m}{2F}$$

A PLL circuit comprising a voltage-controlled oscillator (VCO) may be used in a FMCW radar detection system to generate variable frequency signals (e.g., "chirp" signals).

It is noted that a wide tuning range for a voltage-controlled oscillator in the radar sensor may be involved to satisfy the FMCW standard specifications, e.g., in particular for short-range radar sensors having a frequency sweep range of 4 GHz.

On one hand, a large frequency range F facilitates increasing the resolution of a FMCW radar system, insofar as a proportional relation between the accuracy of the distance measurement and the signal sweeping bandwidth F exists.

On the other hand, the resolution of a FMCW radar system is limited by the phase noise.

It is noted that it may be difficult to achieve both a wide frequency tuning range and a low phase noise in a voltage-controlled oscillator, insofar as varactors used in voltage-controlled oscillators may have a low quality factor (Q) at such high frequency (e.g., between 76 GHz and 81 GHz). The use of large area varactors may facilitate meeting the tuning range requirements, but it may result in high phase noise and high power consumption.

Therefore, improved tuning strategies for voltage-controlled oscillators in PLL circuits may be desirable.

SUMMARY

One or more embodiments may relate to a circuit.
One or more embodiments may relate to a corresponding radar sensor.
One or more embodiments may relate to a corresponding vehicle.
One or more embodiments may relate to a corresponding method of operating the circuit.

According to one or more embodiments, a circuit (e.g., a voltage-controlled oscillator) is provided which may include a tunable resonant circuit having a first node and a second node. The tunable resonant circuit may include an inductance coupled between the first node and the second node, a variable capacitance coupled between the first node and the second node, and a set of capacitances selectively coupleable between the first node and the second node. The circuit may include an input control node coupled to the variable capacitance and to the set of capacitances. The input control node is configured to receive an input control signal. The tunable resonant circuit may be tunable as a function of the input control signal. The circuit may include a biasing circuit coupled to the tunable resonant circuit and configured to bias the tunable resonant circuit to generate a variable-frequency output signal between the first node and the second node.

According to one or more embodiments, the circuit may further comprise a voltage divider network configured to generate a set of different voltage thresholds, and a set of comparator circuits with hysteresis configured to compare the input control signal to the set of different voltage thresholds to generate a respective set of control signals. The capacitances in the set of capacitances may be selectively coupleable between the first node and the second node as a function of respective control signals in the set of control signals.

One or more embodiments may thus facilitate a fast and continuous coarse tuning of the oscillator circuit suitable for use in automotive radar sensors, while performing fine tuning using small varactor(s). The use of small varactors may reduce the power consumption and the phase noise.

Also disclosed herein is a circuit including a tunable resonance circuit, control circuitry, and a biasing circuit. The tunable resonant circuit includes an inductance directly electrically connected in series between first and second nodes, a variable capacitance directly electrically connected between the first and second nodes, and a set of switched capacitances coupled between the first and second nodes, with the set of switched capacitances including a plurality of capacitance units, each capacitance unit comprising a first capacitance for that capacitance unit directly electrically connected between the first node and a switch and a second capacitance for the capacitance unit directly electrically connected between the switch and the second node. The control circuitry is configured to receive an input control signal and connected to control the switches of the set of switched capacitances. The biasing circuit is directly electrically connected to the tunable resonance circuit at the first and second nodes.

The variable capacitance may be formed by first and second variable capacitors directly electrically connected in series between the first and second nodes, with a tap between the first and second variable capacitors coupled to receive the input control signal.

The inductance may be formed by a single inductor directly electrically connected between the first and second nodes.

The inductance may be formed by first and second inductors directly electrically connected in series between the first and second nodes, with a tap between the first and second inductors coupled to receive the input control signal.

The variable capacitance may be formed by first and second variable capacitors directly electrically connected in series between the first and second nodes, with a tap between the first and second variable capacitors coupled to ground.

The biasing circuit may include a first transistor having a drain coupled to the first node, a source coupled to ground, and a gate coupled to the second node, and a second transistor having a drain coupled to the second node, a source coupled to ground, and a gate coupled to the first node.

The control circuitry may include a digital-to-analog converter configured to receive the input control signal as input and generate a control word for the switches of the set of switched capacitances as output.

The control circuitry may alternatively include a resistive ladder coupled between a supply voltage and ground, with different threshold voltages being generated at respective taps between resistors of the resistive ladder, and a plurality of hysteretic comparators each having: an inverting input coupled to a different one of the taps; a non-inverting input coupled to the input control signal; and an output coupled to a respective switch of one of the set of switched capacitances.

The circuit may further include a phase frequency comparator having inputs coupled to receive a feedback signal and a reference signal, a charge pump having an input coupled to an output of the phase frequency comparator, a filter configured to receive output from the charge pump and generate the input control signal, and a divisor configured to receive an output from the tunable resonance circuit and output the feedback signal.

Also disclosed herein is a method of operating a tunable resonant circuit, including: receiving an input control signal at a tap node between first and second inductances coupled in series between first and second nodes; receiving a control word at a set of switched capacitances coupled between the first and second nodes, the set of switch capacitances including a plurality of capacitance units, each capacitance unit comprising a first capacitance for that capacitance unit coupled between the first node and a switch and a second capacitance for that capacitance unit coupled between the switch and the second node; and receiving the input control signal at inputs of a flash analog-to-digital converter (ADC). The method includes operating the flash ADC to: quantize an operating frequency range for an output signal produced between the first and second nodes as $M \cdot \Delta f$, where M is an integer value ranging from 0 to N−1, where N is a number of intervals into which a frequency range for the output signal is divided, and where $\Delta f$ is a resulting frequency step produced by the quantization; and generate a value of M based upon the input control signal and outputting the control word to the switches of the plurality of capacitance units to close ones of those switches associated with the control word to thereby coarsely tune a frequency of the output signal; and performing a fine continuous tuning of the frequency of the output signal by adjusting an adjustable capacitance coupled between the first and second nodes.

The method may further include: comparing a feedback frequency to a reference frequency to produce a charge pump control signal; generating a charge pump output based upon the charge pump control signal; filtering the charge pump output to produce the input control signal; and dividing the output signal by a divisor to produce the feedback signal having the feedback frequency.

Quantizing the operating frequency range and generating the value of M may be performed by: generating a series of threshold voltages using a resistive ladder coupled between a supply voltage and ground; comparing the input control word to each threshold voltage using a plurality of hysteretic comparators; and generating the control word as outputs of each of the plurality of hysteretic comparators.

The control word may be formatted as a thermometer code.

Also disclosed herein is a circuit, including a tunable resonant circuit and a flash analog-to-digital converter (ADC). The tunable resonant circuit includes first and second inductances coupled in series between first and second nodes, with a tap node between the first and second inductances configured to receive an input control signal, first and second variable capacitances coupled between the first and second nodes, and a set of switched capacitances coupled between the first and second nodes, the set of switch capacitances including a plurality of capacitance units, with each capacitance unit comprising a first capacitance for that capacitance unit coupled between the first node and a switch and a second capacitance for the capacitance unit coupled between the switch and the second node. The flash analog-to-digital converter (ADC) is configured to receive the input control signal and perform a coarse quantized tuning of a frequency of an output signal produced between the first and second nodes by: quantizing an operating frequency range for the output signal produced between the first and second nodes as M·Δf, where M is an integer value ranging from 0 to N−1, where N is a number of intervals into which a frequency range for the output signal is divided, and where Δf is a resulting frequency step produced by the quantization; and generating a value of M based upon the input control signal and outputting a control word to the switches of the plurality of capacitance units to close ones of those switches associated with the control word to thereby coarsely tune a frequency of the output signal.

The flash ADC may include a resistive ladder coupled between a supply voltage and ground, with different threshold voltages being generated at respective taps between resistors of the resistive ladder, and a plurality of hysteretic comparators each having: an inverting input coupled to a different one of the taps; a non-inverting input coupled to a respective bit of the input control signal; and an output coupled to a respective switch of one of the set of switched capacitances.

The control word may be formatted as a thermometer code.

A biasing circuit may be directly electrically connected between the first and second nodes.

The circuit may further include a phase frequency comparator having inputs coupled to receive a feedback signal and a reference signal, a charge pump having an input coupled to an output of the phase frequency comparator, a filter receiving output from the charge pump and configured to generate the input control signal, and a divisor configured to receive an output from the tunable resonance circuit and output the feedback signal.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, certain structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

For simplicity, throughout the figures annexed herein, like parts or elements are indicated with like references/numerals. For brevity, a corresponding description will not be repeated for each and every figure.

Figure 1:
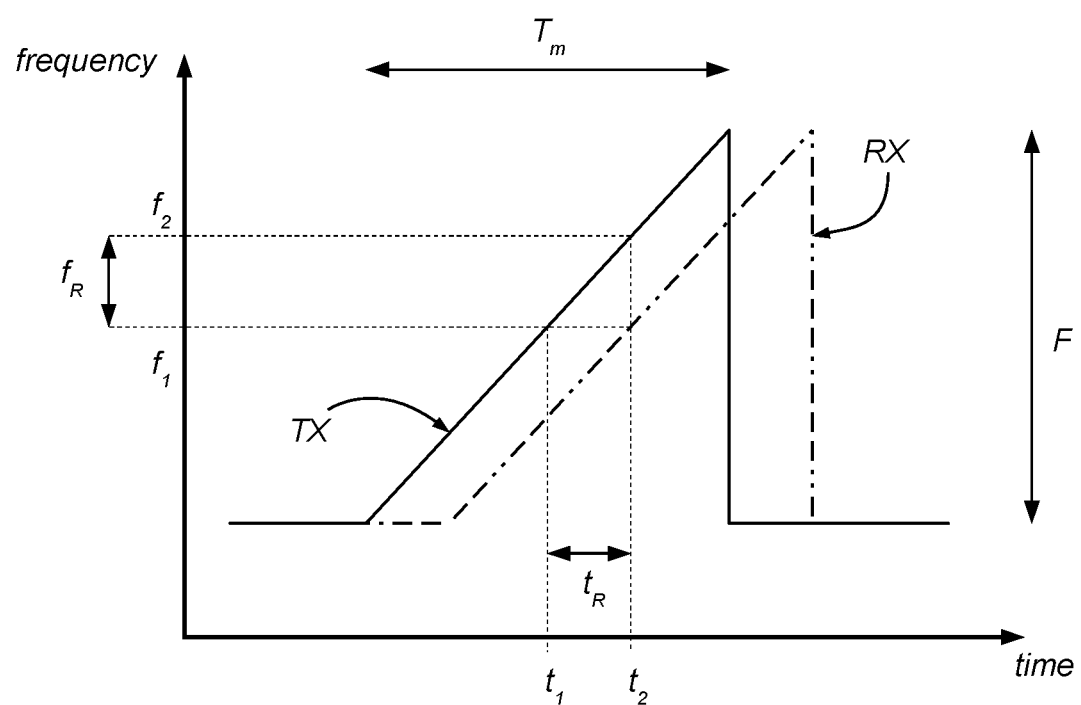
FIG. 1, which was described in the foregoing, is a diagram exemplary of a possible time-frequency relationship of radar signals in a frequency-modulated continuous-wave (FMCW) radar system.
Figure 2:
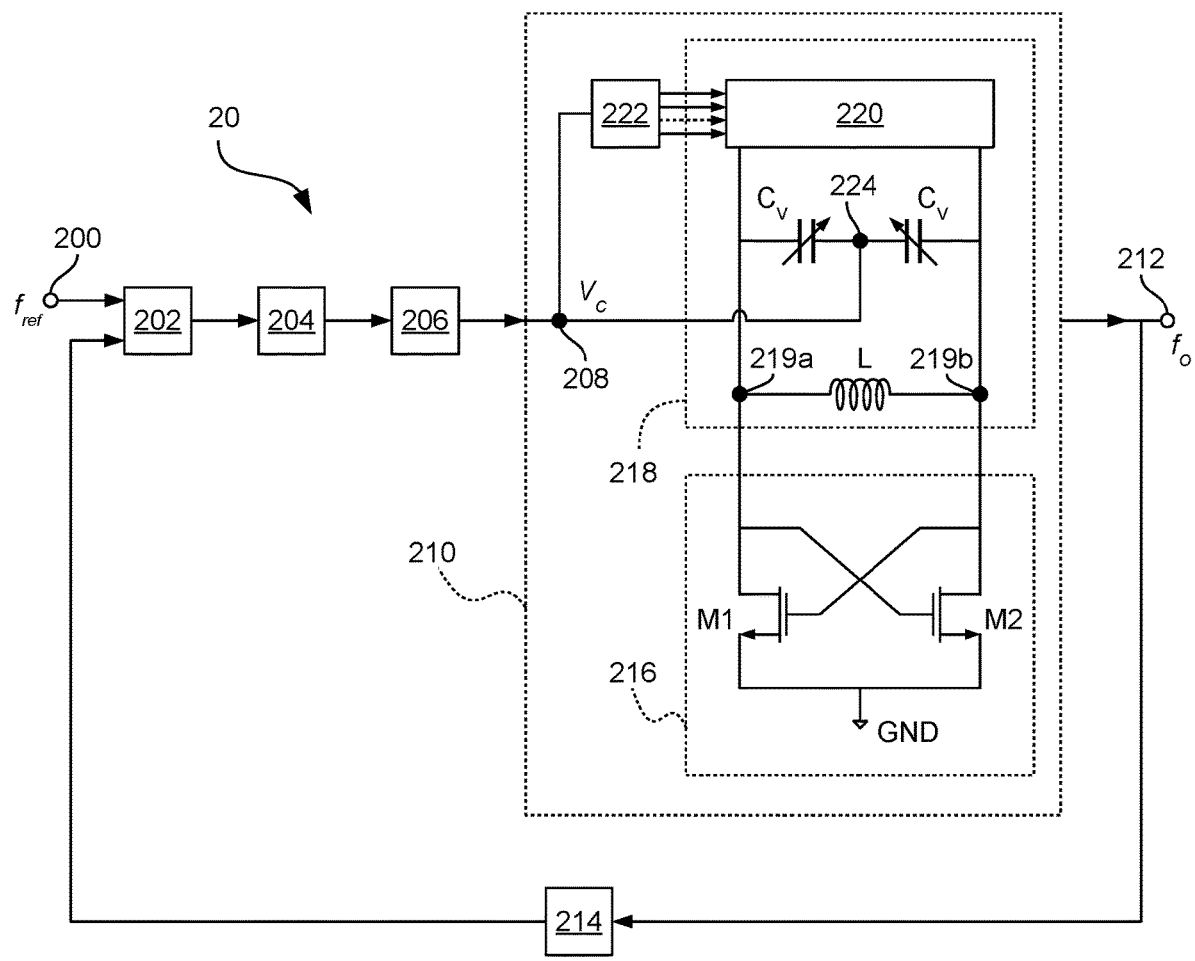
FIG. 2 is a circuit block diagram exemplary of a PLL circuit as possibly used in a radar sensor.

By way of introduction to the detailed description of exemplary embodiments, reference may first be made to FIG. 2.

FIG. 2 is a circuit block diagram exemplary of a phase lock loop (PLL) circuit 20 as possibly used in a radar sensor. The PLL circuit 20 may comprise: an input node 200 configured to receive an input reference signal $f_{ref}$; a phase-frequency detector (PFD) circuit 202 having a first input configured to receive the input reference signal $f_{ref}$; a charge pump (CP) circuit 204 coupled at the output of the phase-frequency detector circuit 202; a low-pass filter circuit 206 coupled at the output of the charge pump circuit 204 and configured to generate, at a respective output node 208, a control signal $V_C$; a voltage-controlled oscillator (VCO) circuit 210 coupled at node 208 and controlled by the control signal $V_C$, the voltage-controlled oscillator circuit 210 configured to generate at an output node 212 an output signal $f_O$; and a feedback loop configured to provide the output signal $f_O$ at a second input of the phase-frequency detector circuit 202.

The feedback loop may optionally comprise a frequency divider circuit 214.

As exemplified in FIG. 2, the voltage-controlled oscillator circuit 210 may comprise an active core 216 (e.g., a biasing circuit) coupled to an LC resonant circuit 218.

The active core 216 may comprise a pair of transistors M1 and M2, e.g., metal-oxide semiconductor (MOS) field-effect transistors. As exemplified in FIG. 2, a first transistor M1 may have a source terminal coupled to ground GND and a drain terminal coupled to a first terminal 219a of the LC resonant circuit 218, and a second transistor M2 may have a source terminal coupled to ground GND and a drain terminal coupled to a second terminal 219b of the LC resonant circuit 218. The control (gate) terminal of the first transistor M1 may be coupled to the drain terminal of the second transistor M2, and the control (gate) terminal of the second transistor M2 may be coupled to the drain terminal of the first transistor M1.

As exemplified in FIG. 2, the LC resonant circuit 218 may comprise an inductive component and a capacitive component coupled between the first terminal 219a and the second terminal 219b of the LC resonant circuit 218.

As exemplified herein, the inductive component may comprise an inductor L and the capacitive component may comprise one or more (e.g., a pair of) variable capacitors or varactors $C_V$ coupled in series, with the control signal $V_C$ being applied at a node 224 intermediate the two varactors $C_V$.

As exemplified in FIG. 2, the LC resonant circuit 218 may further comprise an array (or bank) of capacitors 220 coupled in parallel to the varactor(s) $C_V$. The array of capacitors 220 may be configured to receive a set of configuration signals from an analog-to-digital converter circuit 222. The analog-to-digital converter 222 may be coupled to node 208 to receive the control signal $V_C$. For instance, the analog-to-digital converter 222 may be an N-bit ADC and the array of capacitors 220 may comprise $2^N$ unit capacitors.

The configuration signals (e.g., an N-bit binary signal generated by the ADC 222) may be used to activate and de-activate a set of switches respectively coupled to the capacitors in the array of capacitors 220, so that the overall capacitance of the capacitive component of the LC resonant circuit 218 may be changed to tune the output frequency of the voltage-controlled oscillator 210.

In a PLL circuit 20 as exemplified in FIG. 2, the analog-to-digital converter 222 and the array of capacitors 220 may be used to perform a coarse tuning of the LC resonant circuit 218, and the varactor(s) $C_V$ may be used to perform a fine tuning of the LC resonant circuit 218. This tuning strategy may advantageously avoid the use of large varactors which may lead to high power consumption and high phase noise.

Figure 3:
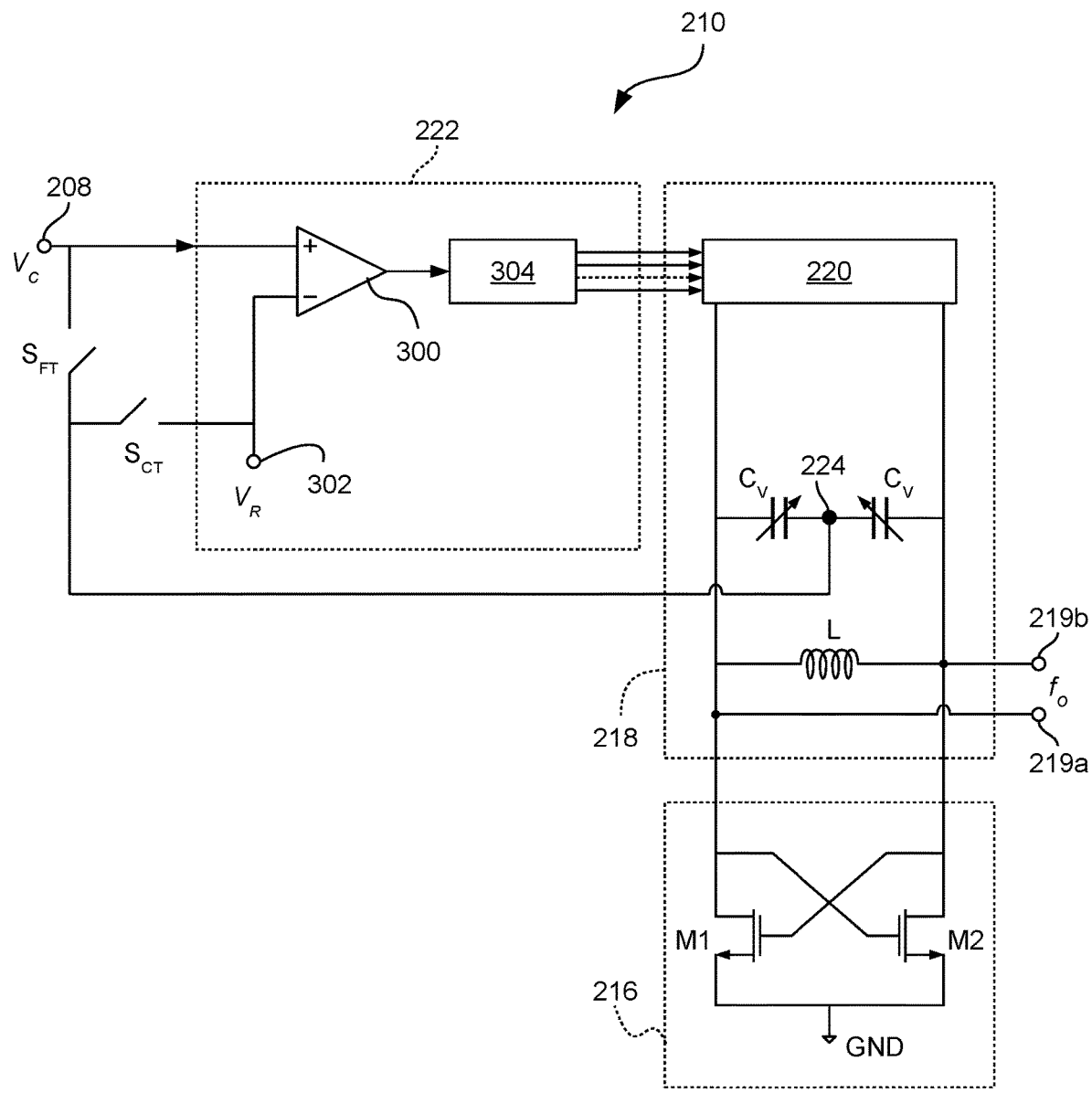
FIG. 3 is a circuit block diagram exemplary of a voltage-controlled oscillator circuit as possibly used in a PLL circuit.

As exemplified in FIG. 3, which is a circuit block diagram exemplary of possible implementation details of a voltage-controlled oscillator circuit 210 for use in a PLL circuit 20, the analog-to-digital converter 222 may comprise a successive approximation analog-to-digital converter (SA-ADC).

A successive approximation analog-to-digital converter may comprise a comparator circuit 300 having a first (e.g., non-inverting) input coupled to node 208 to receive the control signal $V_C$ and a second (e.g., inverting) input coupled to a node 302 to receive a reference signal $V_R$. For instance, the reference signal $V_R$ may be equal to half of a supply voltage $V_{CC}$ of the PLL circuit 20 (i.e., $V_R=V_{CC}/2$). The successive approximation analog-to-digital converter may further comprise a successive approximation register (SAR) 304 configured to receive an output signal from the comparator circuit 300 and to provide the N-bit configuration signal to the array of capacitors 220.

As exemplified in FIG. 3, a first switch $S_{FT}$ may be provided in the propagation path between the configuration node of the LC resonant circuit 218 (here, the node 224 intermediate the varactors $C_V$) and the first input of the comparator circuit 300 (i.e., node 208), and a second switch $S_{CT}$ may be provided in the propagation path between the configuration node of the LC resonant circuit 218 and the second input of the comparator circuit 300 (i.e., node 302).

Therefore, tuning of a voltage-controlled oscillator circuit 210 as exemplified in FIG. 3 may be performed in two steps to avoid instability.

In the first tuning step, the first switch $S_{FT}$ is opened and the second switch $S_{CT}$ is closed. The varactor(s) $C_V$ provide a constant capacitance value (e.g., an average value) and the ADC converter 222 achieves a coarse frequency tuning by enabling a selected subset of the capacitors in the array of capacitors 220.

In the second tuning step, the first switch $S_{FT}$ is closed and the second switch $S_{CT}$ is opened. The varactor(s) $C_V$ is connected to the control voltage $V_C$ and changes its capacitance value to provide a fine frequency tuning.

It is noted that two different tuning strategies may be implemented in a voltage-controlled oscillator circuit 210 comprising a successive approximation ADC, as exemplified in FIG. 3.

Figure 4:
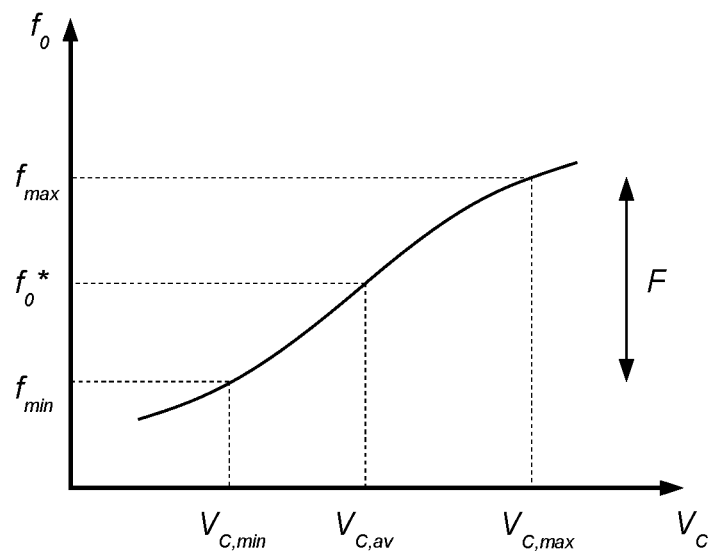
FIGS. 4 and 5 are diagrams exemplary of possible tuning strategies for voltage-controlled oscillator circuits.

According to a first tuning strategy as exemplified in FIG. 4, the coarse frequency tuning step sets the output frequency of the PLL circuit to an average value $f_0^*$ between the minimum frequency $f_{min}$ and the maximum frequency $f_{max}$ of the entire frequency sweep range F (e.g., 77 GHz to 81 GHz, or 76 GHz to 77 GHz) while the varactor(s) $C_V$ in the LC resonant circuit 218 is held to its average value. After the coarse frequency tuning step, the varactor(s) $C_V$ is used to provide the entire frequency variation from $f_{min}$ to $f_{max}$. In other words, the fine tuning step is responsible for covering the overall frequency range F.

An advantage of such a first tuning strategy is that coarse tuning can be carried out just once (for instance, at the start-up of the radar detection system), thus facilitating a continuous frequency tuning as demanded to automotive radar sensors. A drawback of such a first tuning strategy is that it may involve large varactor(s) $C_V$, possibly resulting in high power consumption and high phase noise.

Figure 5:
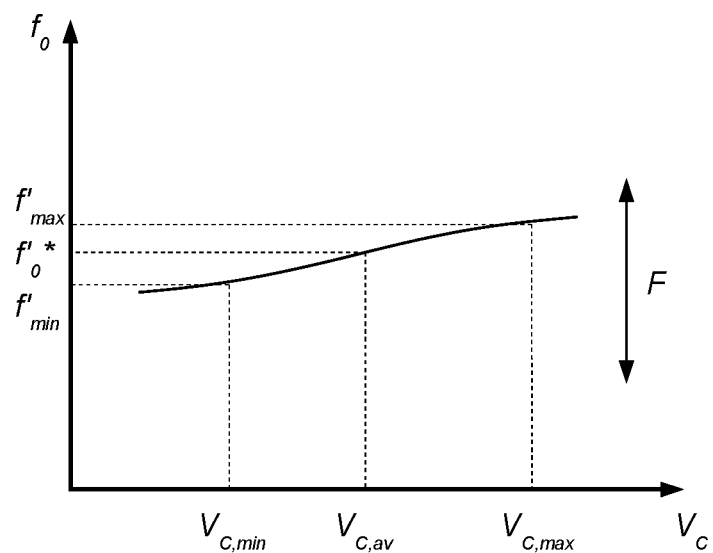

According to a second tuning strategy as exemplified in FIG. 5, the coarse frequency tuning step sets the output frequency of the PLL circuit to an average value $f'_0^*$ between a lower frequency $f'_{min}$ and a higher frequency $f'_{max}$ which define a sub-range of the entire frequency sweep range F (e.g., 77 GHz to 81 GHz, or 76 GHz to 77 GHz) while the varactor(s) $C_V$ in the LC resonant circuit 218 is held to its average value. After the coarse frequency tuning step, the varactor(s) is used to provide the (smaller) frequency variation from $f'_{min}$ to $f'_{max}$. In other words, the fine tuning step is responsible for covering only a sub-range of the overall frequency range F.

An advantage of such a second tuning strategy is that it may involve small varactor(s) $C_V$, resulting in low power consumption and low phase noise. A drawback of such a second tuning strategy is that it may involve performing the coarse tuning step multiple times during each frequency sweep, resulting in a delay time $T_D$ in the response of the PLL circuit which is equal to N times the settling time $\tau_s$ of the PLL circuit (i.e., $\tau_D=N\cdot\tau_s$). Additionally, such a second tuning strategy may not be suitable for automotive radar applications due to the large delay time and the two-step frequency tuning operation.

The following documents (all of which are incorporated by reference in their entirety) are exemplary of possible strategies for tuning a PLL circuit 20 with the use of a successive approximation analog-to-digital converter as exemplified in FIG. 3: Shi, et al., "A dual loop dual VCO CMOS PLL using a novel coarse tuning technique for DTV," 2008 9th International Conference on Solid-State and Integrated-Circuit Technology, Beijing, 2008, pp. 1597-1600, doi: 10.1109/ICSICT.2008.4734882; and Hou, et al., "A 20 GHz PLL for 40 Gbps SerDes application with 4 bit switch-capacitor adaptive controller," 2014 IEEE International Conference on Electron Devices and Solid-State Circuits, Chengdu, 2014, pp. 1-2, doi: 10.1109/ED-SSC.2014.7061152.

In both cases, those solutions may not be satisfactory insofar as additional time is needed for performing a coarse tuning, and a clock signal is needed (i.e., both solutions are clock-based).

One or more embodiments may thus aim at providing an improved tuning system for a PLL circuit to be used, for instance, in an automotive radar application.

Figure 6:
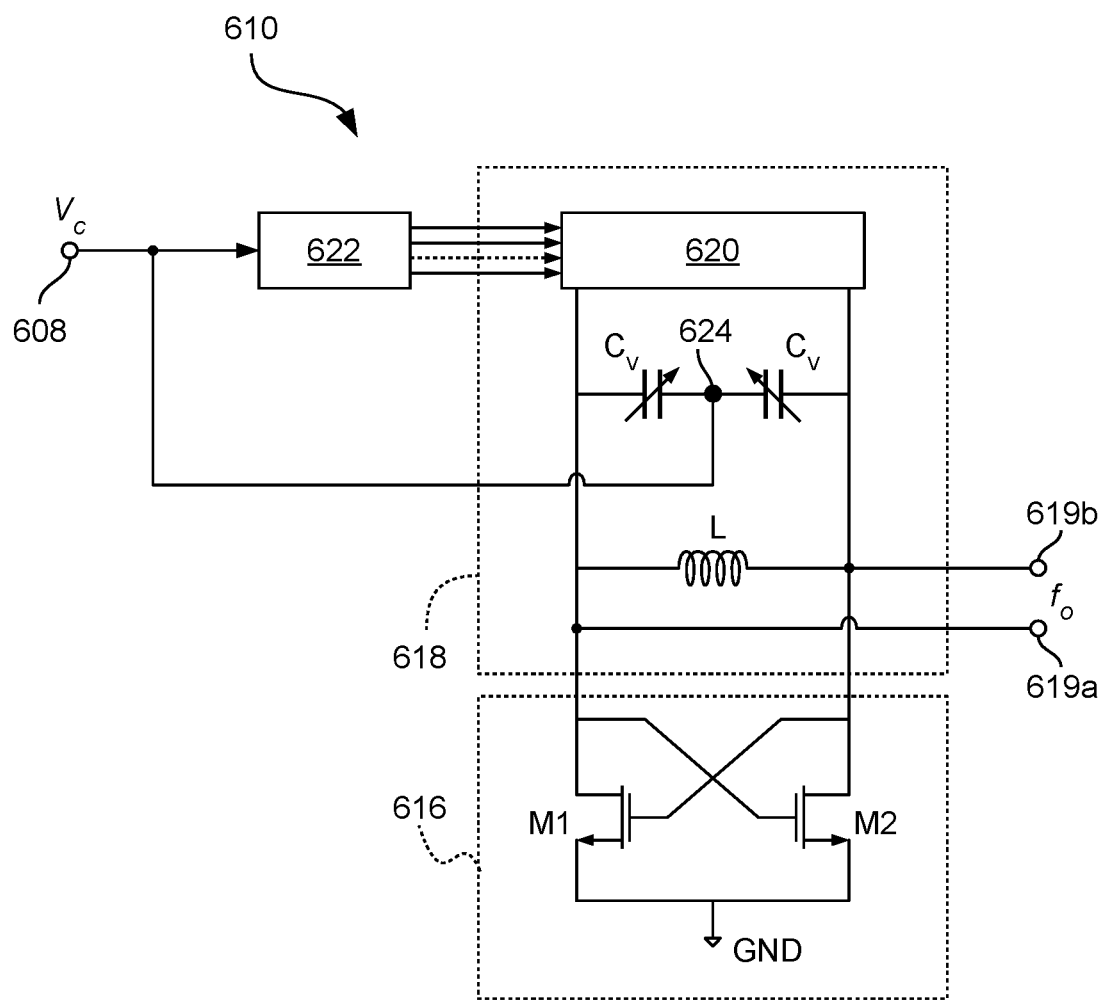
FIGS. 6 and 7 are circuit block diagrams exemplary of voltage-controlled oscillator circuits according to one or more embodiments of the present description.

FIG. 6 is a circuit block diagram exemplary of a voltage-controlled oscillator circuit 610 according to one or more embodiments, for use in a PLL circuit architecture as exemplified in FIG. 2.

As exemplified in FIG. 6, a voltage-controlled oscillator circuit 610 may comprise an active core 616 coupled to an LC resonant circuit 618.

The active core 616 may comprise a pair of transistors M1 and M2, e.g., MOS field-effect transistors. As exemplified in FIG. 6, a first transistor M1 may have a source terminal coupled to ground GND and a drain terminal coupled to a first terminal 619a of the LC resonant circuit 618, and a second transistor M2 may have a source terminal coupled to ground GND and a drain terminal coupled to a second terminal 619b of the LC resonant circuit 618. The control (gate) terminal of the first transistor M1 may be coupled to the drain terminal of the second transistor M2, and the control (gate) terminal of the second transistor M2 may be coupled to the drain terminal of the first transistor M1.

As exemplified in FIG. 6, the LC resonant circuit 618 may comprise an inductive component and a capacitive component coupled between the first terminal 619a and the second terminal 619b of the LC resonant circuit 618.

As exemplified herein, the inductive component may comprise an inductor L and the capacitive component may comprise one or more (e.g., a pair of) variable capacitors or varactors $C_V$ coupled in series, with the control signal $V_C$ received from a node 608 being provided at a node 624 intermediate the two varactors $C_V$.

As exemplified in FIG. 6, the LC resonant circuit 618 may further comprise an array of capacitors 620 coupled in parallel to the varactor(s) $C_V$. The array of capacitors 620 may be configured to receive a set of configuration signals from an analog-to-digital converter 622 coupled to node 608 to receive the control signal $V_C$. For instance, the analog-to-digital converter 622 may be an N-bit ADC and the array of capacitors 620 may comprise $2^N$ unit capacitors.

Purely by way of non-limiting example, one or more embodiments may rely on a thermometer ADC converter which drives eleven unit capacitors.

The configuration signals may be used to activate and de-activate a set of switches respectively coupled to the capacitors in the array of capacitors 620, so that the overall capacitance of the capacitive component of the LC resonant circuit 618 may be changed to tune the voltage-controlled oscillator 610.

In a voltage-controlled oscillator circuit 610 as exemplified in FIG. 6, the analog-to-digital converter 622 and the array of capacitors 620 may be used to perform a coarse tuning of the LC resonant circuit 618, and the varactor(s) $C_V$ may be used to perform a fine tuning of the LC resonant circuit 618.

In one or more embodiments, the analog-to-digital converter 622 may comprise a flash-like ADC architecture. Differently from a conventional flash ADC, the comparators in the flash ADC 622 may be comparators with hysteresis.

Hysteretic behavior of the comparators in the flash ADC 622 may advantageously provide a stable behavior of a PLL circuit comprising a VCO circuit 610 as exemplified in FIG. 6, without the need for a two-step tuning operation. As exemplified in FIG. 6, one or more embodiments may thus not involve the use of switches such as the switches $S_{FT}$ and $S_{CT}$ illustrated in FIG. 3.

Figure 7:
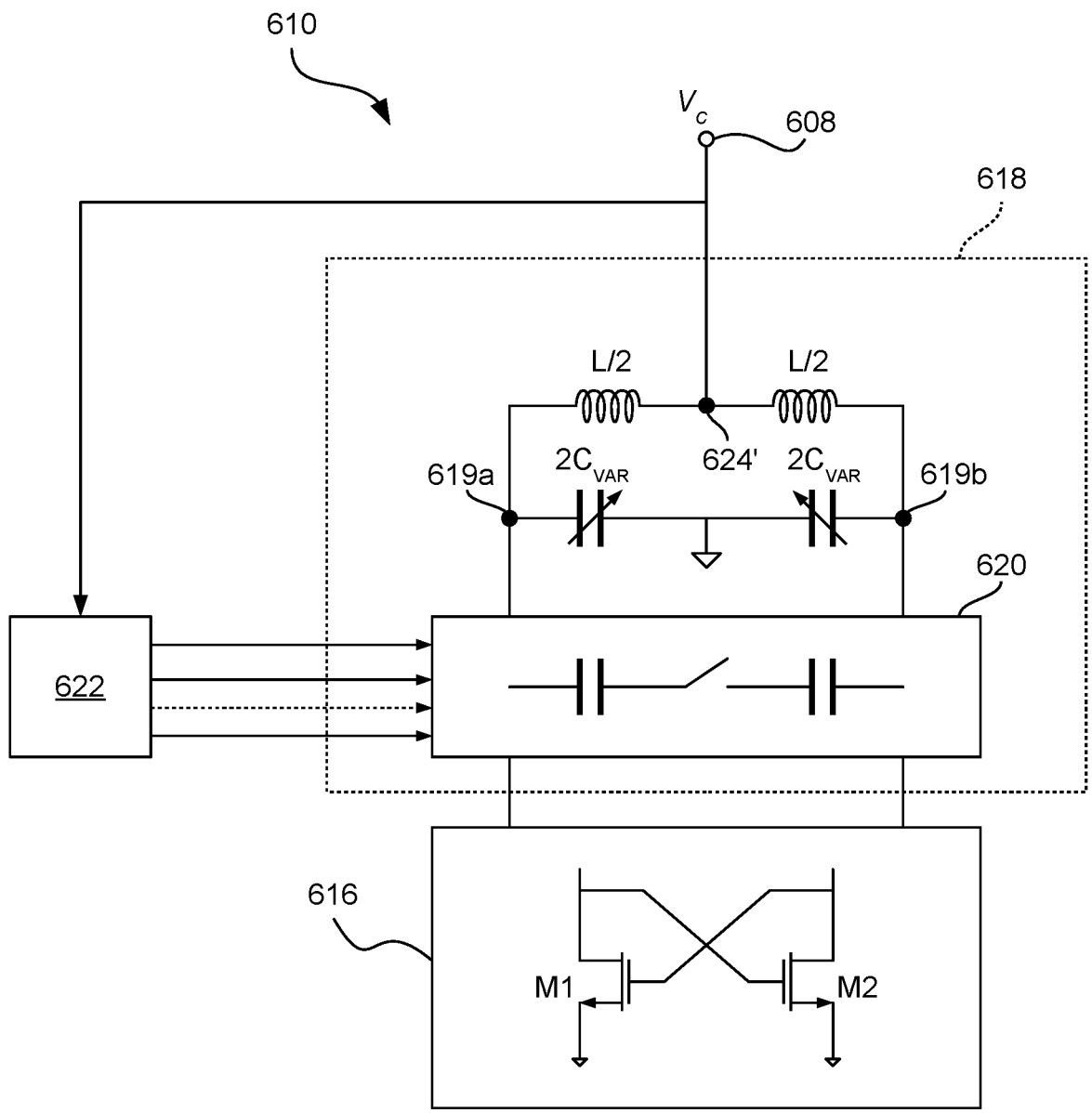

As exemplified in FIG. 7, which is a schematic (e.g., simplified) circuit block diagram of a voltage-controlled oscillator 610 according to one or more embodiments, the operating frequency of the voltage-controlled oscillator 610 may be set by the LC resonant circuit 618 (also referred to as "LC tank" in the present description).

In one or more embodiments, the LC resonant circuit 618 may comprise an inductive component L (here exemplified by two inductors L/2 having an intermediate node 624' coupled to node 608) having a high quality factor Q, and a capacitive component. The capacitive component of the LC resonant circuit 618 may comprise one or more (e.g., a pair of) varactors $2C_{VAR}$ (e.g., small and/or application-optimized varactors) and an array (e.g., a bank) of capacitors 620 having a high quality factor Q. The capacitors in the array of capacitors 620 may be selectively coupleable between the first terminal 619a and the second terminal 619b of the LC resonant circuit 618 by respective switches.

As exemplified in FIG. 7, a flash ADC 622 may be configured to sense the control voltage $V_C$ at node 608 and enable a number of switched capacitors in the array 620 as a function of the control voltage $V_C$.

The enabled capacitors in the array of capacitors 620 may thus produce a coarse tuning of the frequency of the signal generated by the voltage-controlled oscillator 610. The varactor(s) $2C_{VAR}$ may be used to achieve a fine tuning of that frequency.

Figure 8:
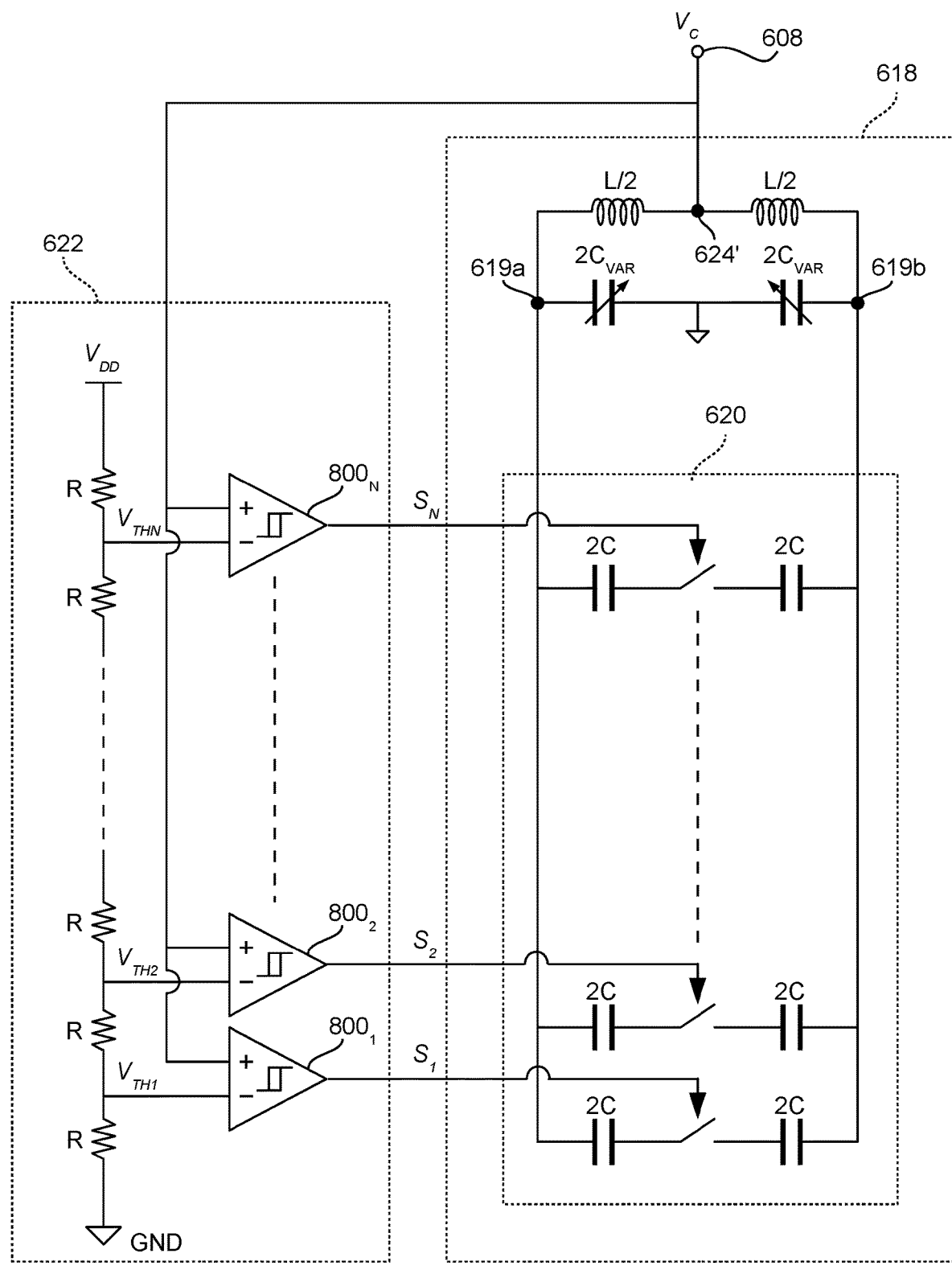
FIG. 8 is a circuit block diagram exemplary of possible implementation details of one or more embodiments of the present description.

FIG. 8 is a circuit block diagram exemplary of possible implementation details of a non-conventional flash ADC 622 and an array of switched capacitors 620 according to one or more embodiments.

As exemplified in FIG. 8, the flash ADC 622 may comprise a voltage divider or "voltage ladder" (e.g., a resistive divider comprising a number of resistors R, such as a number N+1 of resistors having the same resistance value) configured to generate a number N of different voltage levels (e.g., voltage thresholds $V_{TH1}$, $V_{TH2}$, . . . , $V_{THN}$). Such voltage levels may be equally spaced, e.g., between a reference voltage such as a ground voltage (e.g., 0 V) and a supply voltage $V_{DD}$.

The N voltage levels generated by the voltage divider may be provided at the second inputs (e.g., inverting inputs) of a number N of respective comparators with hysteresis $800_1$, $800_2$, . . . , $800_N$ (also collectively designated with reference numeral 800 in the present description). The comparators with hysteresis 800 may receive at their first inputs (e.g., non-inverting inputs) the control voltage $V_C$ from node 608. The comparators with hysteresis 800 may be high-speed, low-power comparators suitable to implement flash ADC conversion. Therefore, the comparators with hysteresis 800 may collectively generate an N-bit output signal $S_1$, $S_2$, . . . , $S_N$ which is a thermometer code or thermometer representation of the control signal $V_C$.

In one or more embodiments, the width of hysteresis of the comparators 800 may be selected so as to facilitate the varactor(s) $C_V$ compensating frequency variations due to the enablement or disablement of a unit capacitor in the array of switched capacitors 620.

As exemplified in FIG. 8, the array of switched capacitors 620 may comprise a number N of high-Q capacitors selectively coupleable between the first terminal 619a and the second terminal 619b of the LC resonant circuit 618 (e.g., in parallel to the varactor(s) $2C_{VAR}$). As exemplified herein, each capacitor may comprise a pair of capacitors 2C connected in series and having a respective switch arranged therebetween.

Each of the N switches in the array of capacitors 620 may be controlled (e.g., opened and closed) as a function of the output signal of a respective comparator with hysteresis 800 (i.e., as a function of a bit $S_1, S_2, \ldots, S_N$ of the thermometer code generated by the comparators 800). Therefore, as a function of the control voltage $V_C$, a subset of the capacitors 2C in the array 620 may be coupled to the LC resonant circuit 618 (e.g., from no capacitors coupled to all the capacitors coupled) to implement a coarse frequency tuning.

Therefore, one or more embodiments may rely on a coarse quantized tuning and a fine continuous tuning of the frequency of the signal generated by the voltage-controlled oscillator 610.

For instance, the coarse frequency tuning may be quantized as M·Δf, where M is an integer value ranging from 0 to N−1, N is the number of intervals into which the operating frequency range (e.g., 76 GHz to 77 GHz for long-range radar sensors, or 77 GHz to 81 GHz for short-range radar sensors) is divided, and Δf is the resulting frequency step.

A number M of the N step can be selected (e.g., instantaneously) by the flash ADC 622. The coarse tuning bank, comprising the array 620 of high-Q switched capacitors 2C, facilitates varying the output frequency of the voltage-controlled oscillator 610 in a quantized manner. The flash ADC 622 may enable a number of switched capacitors 2C proportional to the control voltage $V_C$ of the PLL circuit.

The small varactor(s) $2C_{VAR}$ facilitate fine tuning of the output frequency of the voltage-controlled oscillator 610, so as to adjust the operating frequency within the range defined by the coarse tuning, as exemplified by the following equation:

$$f_{OP} = N_{DIV} \cdot f_{REF} = f_{MIN} + M \cdot \Delta f + V_C \cdot K_{VCO}$$

wherein $f_{OP}$ is the output frequency of the voltage controlled oscillator 610, $N_{DIV}$ is the (optional) frequency division factor of the feedback loop of the PLL circuit (see, e.g., block 214 in FIG. 2), $f_{REF}$ is the frequency of the reference signal $f_{ref}$ at the input of the PLL circuit (see, e.g., node 200 in FIG. 2), $f_{MIN}$ is the base frequency generated by the voltage-controlled oscillator 610, M is the number of capacitors in the array 620 enabled as a function of the control signal $V_C$, Δf is the coarse tuning frequency step, and $K_{VCO}$ is the tuning proportionality factor of the varactor(s) $2C_{VAR}$ in the voltage-controlled oscillator 610.

Figure 9:
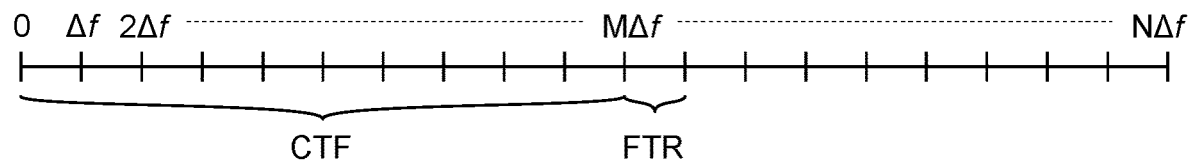
FIG. 9 is a diagram exemplary of a PLL tuning strategy according to one or more embodiments of the present description.

FIG. 9 is exemplary of a coarse, quantized tuning frequency CTF defined by the array of switched capacitors 620 and a fine, continuous tuning range FTR managed via the varactor(s) $2C_{VAR}$.

Therefore, in one or more embodiments a fast selection of the operating frequency may be achieved thanks to an advanced tuning system. The locking time of the PLL circuit may be set by the fine tuning loop, insofar as the flash ADC 622 may act almost instantaneously. Each flash conversion enables a specific switched capacitor of the capacitor array 620 via the high speed comparators 800 having different switching threshold voltages.

It is noted that reference to a "flash ADC" is made throughout the present description to collectively designate the voltage divider and the comparators 800, which generate a thermometer code indicative of the value of the control signal $V_C$. Irrespective of the use of the designation "flash ADC", one or more embodiments may or may not comprise an encoder circuit configured to convert the thermometer code to a binary signal, insofar as such a conversion to a binary signal may or may not be needed in different embodiments.

It is noted that the inductive component and the capacitive component in the LC resonant circuit 618 may be arranged according to various arrangements which are otherwise known to the person skilled in the art (compare, for instance, the different arrangements exemplified in FIGS. 6 and 7), without departing from the scope of this disclosure. For instance, one or more embodiments may comprise one of a Hartley oscillator, a Colpitts oscillator or a Clapp oscillator.

One or more embodiments may thus provide one or more of the following advantages: fast coarse tuning suitable for use in automotive radar sensors, insofar as continuous tuning operation is preserved (no need for a two-step tuning routine); small varactors used for the fine tuning, insofar as the coarse tuning leads to an output frequency that is close to the final output frequency, with small varactors resulting in low power consumption and low phase noise; the possibility of dispensing with a clock signal; and the possibility of implementing a PLL circuit according to one or more embodiments integrated in a 28 nm FD-SOI CMOS technology.

Figure 10:
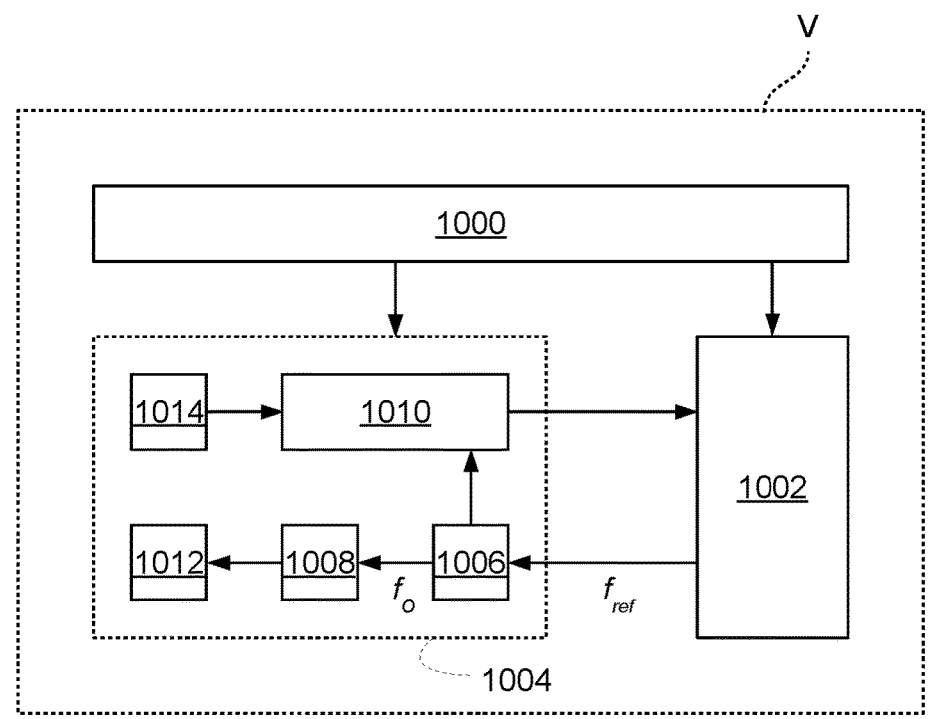
FIG. 10 is a circuit block diagram exemplary of a radar architecture in a vehicle according to one or more embodiments of the present description.

As exemplified in FIG. 10, one or more embodiments may be applied in a vehicle V. The vehicle V may comprise a power supply system 1000, a control unit 1002 (e.g., a microcontroller unit, MCU) and a radar sensor 1004.

The radar sensor 1004 may comprise a PLL circuit 1006, a transmitter circuit 1008, a receiver circuit 1010, transmitter antenna 1012, and a receiver antenna 1014.

The power supply system 1000 may provide a supply voltage (e.g., equal to 1 V or 3.3 V) to the radar sensor 1004 and a supply voltage (e.g., equal to 3.3 V or 5 V) to the control unit 1002.

The control unit 1002 may provide an input reference signal $f_{ref}$ to control the PLL circuit 1006. The PLL circuit 1006 may provide a variable-frequency signal $f_O$ to drive the transmitter circuit 1008 (e.g., according to a FMCW driving scheme). The transmitter circuit may bias the transmitter antenna 1012 accordingly, to emit a transmission signal TX.

The receiver antenna 1014 may receive the echo signal RX and provide it to the receiver circuit 1010 which processes the information about the transmitted and received signals to provide information about the distance of a target object.

As exemplified herein, a circuit (e.g., 610) such as a voltage-controlled oscillator may comprise: a tunable resonant circuit (e.g., 618) having a first node (e.g., 619a) and a second node (e.g., 619b) and comprising an inductance (e.g., L; L/2) coupled between said first node and said second node, a variable capacitance (e.g., $C_V$; $2C_{VAR}$) coupled between said first node and said second node, as well as a set of capacitances (e.g., 620, 2C) selectively coupleable between said first node and said second node; an input control node (e.g., 608) coupled to said variable capacitance and to said set of capacitances, the input control node configured to receive an input control signal (e.g., $V_C$), wherein said tunable resonant circuit is tunable as a function of said input control signal; and a biasing circuit (e.g., 616) coupled to said tunable resonant circuit and configured to bias the tunable resonant circuit to generate a variable-frequency output signal (e.g., $f_O$) between said first node and said second node.

As exemplified herein, the circuit may further comprise: a voltage divider network (e.g., $V_{DD}$, R) configured to generate a set of different voltage thresholds (e.g., $V_{TH1}$, $V_{TH2}$, . . . , $V_{THN}$); and a set of comparator circuits with hysteresis (e.g., 800₁, 800₂, . . . , 800_N) configured to compare said input control signal to said set of different voltage thresholds to generate a respective set of control signals (e.g., $S_1, S_2, \ldots, S_N$).

As exemplified herein, the capacitances in said set of capacitances may be selectively coupleable between said first node and said second node as a function of respective control signals in said set of control signals.

As exemplified herein, the capacitances in said set of capacitances may be configured to be selectively coupled between said first node and said second node in response to a respective control signal in said set of control signals being indicative of said input control signal being higher than a respective voltage threshold in said set of different voltage thresholds.

As exemplified herein, the variable capacitance may comprise a pair of variable capacitors (e.g., $C_V$) arranged in series between said first node and said second node. Optionally, the pair of variable capacitors may have a configuration node (e.g., 624) arranged therebetween configured to receive said input control signal.

As exemplified herein, the inductance may comprise a pair of inductors (e.g., L/2) arranged in series between said first node and said second node. Optionally, the pair of inductors may have a configuration node (e.g., 624') arranged there between configured to receive said input control signal.

As exemplified herein, the voltage divider network may be configured to generate equally spaced voltage thresholds.

As exemplified herein, the circuit may further comprise: an input node (e.g., 200) configured to receive an input reference signal (e.g., $f_{ref}$); a phase-frequency detector circuit (e.g., 202) configured to receive said input reference signal and said variable-frequency output signal; a charge pump circuit (e.g., 204) configured to receive an output signal from the phase-frequency detector circuit; and a low-pass filter (e.g., 206) configured to receive an output signal from the charge pump circuit and to generate said input control signal.

As exemplified herein, a radar sensor (e.g., 1004) may comprise a circuit (e.g., 1006) according to one or more embodiments and a transmitter circuit (e.g., 1008) coupled to an antenna (e.g., 1012). The circuit in the radar sensor may be configured to receive said input reference signal from a microcontroller unit (e.g., 1002) and provide said variable-frequency output signal to said transmitter circuit.

As exemplified herein, a vehicle (e.g., V) may comprise a radar sensor according to one or more embodiments.

As exemplified herein, a method of operating a circuit according to one or more embodiments may comprise: receiving an input control signal at said input control node coupled to said variable capacitance and to said set of capacitances, and tuning said tunable resonant circuit as a function of said input control signal; generating a set of different voltage thresholds; comparing said input control signal to said set of different voltage thresholds to generate a respective set of control signals; selectively coupling the capacitances in said set of capacitances between said first node and said second node as a function of respective control signals in said set of control signals; and biasing the tunable resonant circuit to generate a variable-frequency output signal between said first node and said second node.

As exemplified herein, said comparing may comprise comparing with hysteresis said input control signal to said set of different voltage thresholds.

Without prejudice to the underlying principles, the details and embodiments may vary, even significantly, with respect to what has been described by way of example only, without departing from the extent of protection.

The extent of protection is determined by the annexed claims.

The invention claimed is:

1. A circuit, comprising:
   a flash analog-to-digital converter (ADC) configured to receive an input control signal and perform a coarse quantized tuning of a frequency of an output signal, produced between a first node and a second node having an inductance coupled therebetween, by:
   quantizing an operating frequency range for the output signal produced between the first node and the second node as M·Δf, where M is an integer value ranging from 0 to N−1, where N is a number of intervals into which a frequency range for the output signal is divided, and where Δf is a resulting frequency step produced by the quantizing; and
   generating a value of M based upon the input control signal and outputting a control word to switches of a plurality of switched capacitance circuits associated with the first node and the second node to close ones of those switches associated with the control word to thereby coarsely tune a frequency of the output signal, the control word being formatted as a thermometer code;
   wherein the flash ADC comprises:
   a voltage divider network coupled between a supply voltage and ground, with different threshold voltages being generated at respective taps between resistors of the voltage divider network; and
   a plurality of hysteretic comparators each having:
   an inverting input coupled to a different one of the taps;
   a non-inverting input coupled to a respective bit of the input control signal; and
   an output coupled to a respective switch of one of the plurality of switched capacitance circuits coupled between the first node and the second node; and
   wherein each of the plurality of switched capacitance circuits includes a first capacitance, for that switched capacitance circuit, coupled between the first node and a switch and a second capacitance, for that switched capacitance circuit, coupled between the switch and the second node.

2. A voltage-controlled oscillator (VCO) circuit, comprising:
   an LC resonant circuit with an inductive component and a capacitive component, including:
   an inductance connected between a first node and a second node; and
   an array of switched capacitor circuits connected between the first node and the second node, and configured to receive a set of configuration signals; and
   an analog-to-digital converter (ADC) coupled to the LC resonant circuit to provide the set of configuration signals, wherein the ADC has a flash ADC architecture configured to sense a control voltage and enable a number of capacitors in the array of switched capacitor circuits based on the control voltage;
wherein the array of switched capacitor circuits is used for coarse tuning of the LC resonant circuit;
wherein the flash ADC architecture includes:
a voltage divider network generating a set of voltage thresholds; and
a plurality of hysteretic comparators, each configured to generate a different part of an N-bit output signal forming the set of configuration signals and representing the control voltage based upon a comparison of one of the set of voltage thresholds to the control voltage; and
wherein the array of switched capacitor circuits comprises:
a plurality of high-Q capacitors selectively coupleable to the LC resonant circuit via switches controlled by the N-bit output signal from the analog-to-digital converter.

3. The VCO circuit of claim 2, wherein plurality of high-Q capacitors include a different pair of high-Q capacitors associated with each one of the switches, with each pair of the high-Q capacitors including: a first capacitor coupled between the first node and the switch associated with that pair of high-Q capacitors, and a second capacitor coupled between the second node and the switch associated with that pair of high-Q capacitors.

4. The VCO circuit of claim 2, wherein the N-bit output signal is formatted as a thermometer code.

5. The VCO circuit of claim 2, further comprising a pair of series-coupled varactors connected between a first node and a second node and receiving the control voltage, wherein the pair of series-coupled varactors is used for fine tuning of the LC resonant circuit.

6. The VCO circuit of claim 2, wherein the LC resonant circuit further comprises an inductance directly electrically connected in series between the first node and the second node.

7. A voltage-controlled oscillator (VCO) circuit, comprising:
an LC resonant circuit with an inductive component and a capacitive component, including:
an inductance connected between a first node and a second node;
an array of switched capacitor circuits connected between the first node and the second node, and configured to receive a set of configuration signals; and
an inductance directly electrically connected in series between the first node and the second node; and
an analog-to-digital converter (ADC) coupled to the LC resonant circuit to provide the set of configuration signals, wherein the ADC has a flash ADC architecture configured to sense a control voltage and enable a number of capacitors in the array of switched capacitor circuits based on the control voltage;
wherein the array of switched capacitor circuits is used for coarse tuning of the LC resonant circuit; and
wherein the inductance comprises first and second inductors directly electrically connected in series between the first node and the second node, with a tap between the first and second inductors coupled to receive the control voltage.

8. A method of operating a voltage-controlled oscillator (VCO), the method comprising:
at a flash analog-to-digital converter (ADC), generating a set of voltage thresholds using a voltage divider network, and comparing an input control signal to the set of voltage thresholds using a plurality of hysteretic comparators; and
enabling a number of capacitors in an array of switched capacitor circuits connected between a first node and a second node based on the comparison of the input control signal to the set of voltage thresholds, for coarse tuning of an LC resonant circuit that also includes an inductance connected between the first and second nodes;
wherein the comparison of the input control signal to the set of voltage thresholds produces an N-bit output signal representative of a control voltage connected to a tap between first and second series connected inductors of the inductance connected between the first node and the second node, with each bit of the N-bit output signal enabling a different one of the capacitors in the array of switched capacitor circuits.

9. The method of claim 8, wherein enabling of the number of capacitors in the array of switched capacitor circuits based on the comparison is performed by closing a switch associated with each of the number of capacitors to be enabled.

10. The method of claim 8, wherein enabling of the number of capacitors in the array of switched capacitor circuits based on the comparison is performed by connecting a corresponding capacitance, associated with each of the number of capacitors to be enabled, between the first node and the second node.

11. The method of claim 8, wherein enabling of the number of capacitors in the array of switched capacitor circuits based on the comparison is performed by closing a corresponding switch, associated with each of the number of capacitors to be enabled, connected between associated first and second capacitances to thereby connect those first and second capacitances in series between the first node and the second node.

12. The method of claim 8, further comprising adjusting a pair of varactors for fine tuning of the LC resonant circuit based on the input control signal.

13. The VCO circuit of claim 7, further comprising a pair of series-coupled varactors connected between a first node and a second node and receiving the control voltage, wherein the pair of series-coupled varactors is used for fine tuning of the LC resonant circuit.

* * * * *